United States Patent
Okuno et al.

(10) Patent No.: US 9,167,693 B2
(45) Date of Patent: Oct. 20, 2015

(54) METHOD OF PRODUCING A WIRED CIRCUIT BOARD

(71) Applicant: NITTO DENKO CORPORATION, Osaka (JP)

(72) Inventors: Tomoaki Okuno, Osaka (JP); Saori Kanezaki, Osaka (JP); Tsuyoshi Oguro, Osaka (JP); Takeshi Kawakami, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 28 days.

(21) Appl. No.: 14/086,445

(22) Filed: Nov. 21, 2013

(65) Prior Publication Data
US 2014/0144680 A1    May 29, 2014

(30) Foreign Application Priority Data

Nov. 26, 2012   (JP) ................................. 2012-257608
Aug. 7, 2013    (JP) ................................. 2013-163772

(51) Int. Cl.
*H05K 3/02*     (2006.01)
*H05K 1/11*     (2006.01)
*H05K 1/05*     (2006.01)
*G11B 5/48*     (2006.01)

(52) U.S. Cl.
CPC .............. *H05K 1/117* (2013.01); *G11B 5/486* (2013.01); *H05K 1/056* (2013.01); *G11B 5/484* (2013.01); *H05K 2201/0154* (2013.01); *H05K 2201/0394* (2013.01); *Y10T 29/49155* (2015.01)

(58) Field of Classification Search
CPC ...................... H01L 2224/73265; H01L 24/11; H05K 3/0023; H05K 1/118; H05K 1/147; H05K 3/007; H05K 3/326; Y10T 29/49124; Y10T 29/49155; Y10T 29/49128; Y10T 29/49117; Y10T 29/49135
USPC ............ 29/847, 825, 829, 846, 849; 174/255, 174/261, 262

See application file for complete search history.

(56) References Cited

U.S. PATENT DOCUMENTS

| | | | |
|---|---|---|---|
| 6,399,989 B1 * | 6/2002 | Dockerty et al. | 257/347 |
| 9,072,207 B2 * | 6/2015 | Ooyabu et al. | 1/1 |
| 2003/0026078 A1 | 2/2003 | Komatsubara et al. | |

FOREIGN PATENT DOCUMENTS

| | | |
|---|---|---|
| JP | 2001-350272 A | 12/2001 |
| JP | 2003-031915 A | 1/2003 |

* cited by examiner

*Primary Examiner* — Thiem Phan
(74) *Attorney, Agent, or Firm* — Jean C. Edwards, Esq.; Edwards Neils PLLC

(57) ABSTRACT

A method of producing a wired circuit board includes a first step of preparing a metal supporting layer, a second step of forming, on one side of the metal supporting layer in a thickness direction thereof, an insulating layer having a first opening, and a plurality of terminal formation portions, a third step of forming, on one side of the insulating layer in the thickness direction, a conductive layer having a plurality of terminal portions each corresponding to the plurality of terminal formation portions, a fourth step of partially removing the metal supporting layer to form a second opening and at least one reinforcing metal supporting portion placed between the plurality of terminal formation portions, and a fifth step of removing the plurality of terminal formation portions exposed from the second opening to expose both side surfaces of the plurality of terminal portions in the thickness direction.

6 Claims, 9 Drawing Sheets

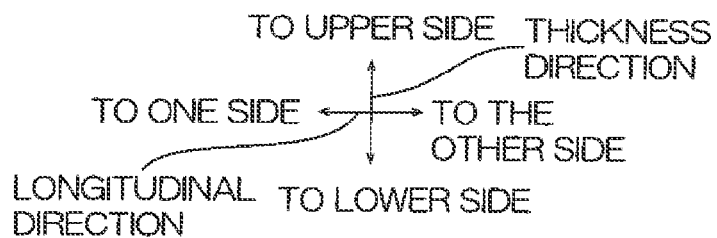
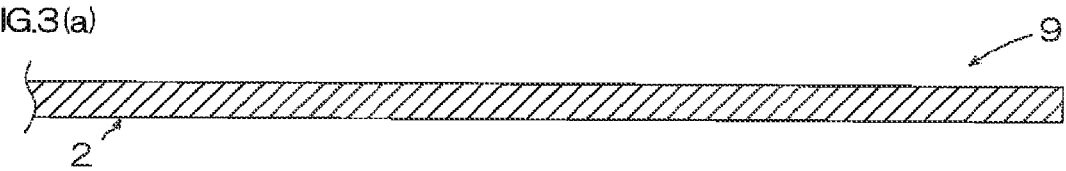
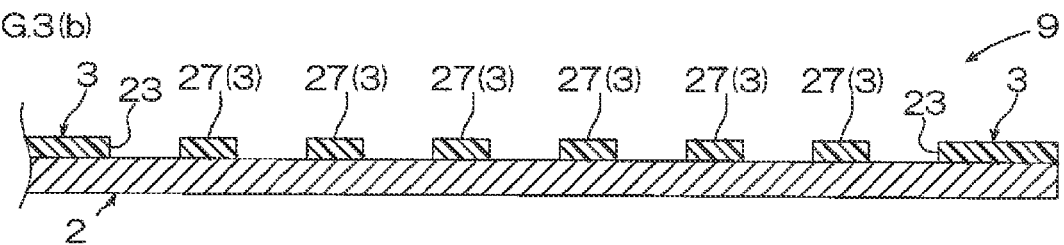
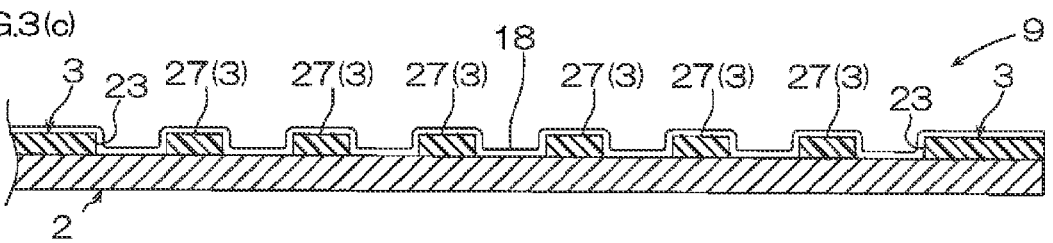
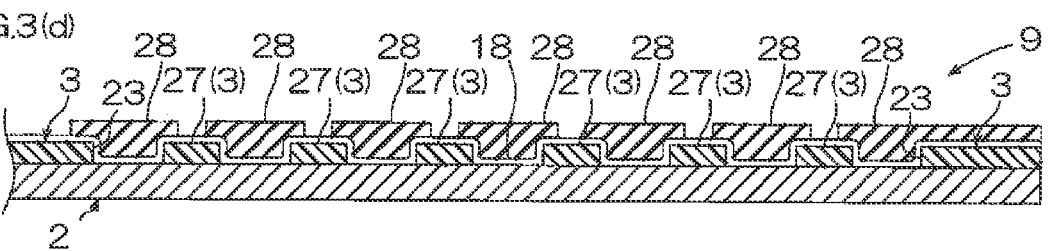

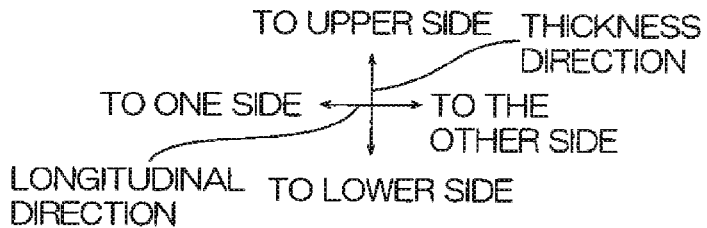
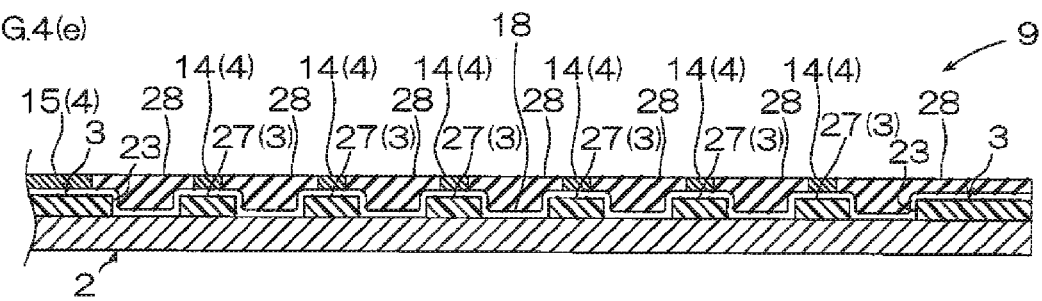
FIG.4(e)
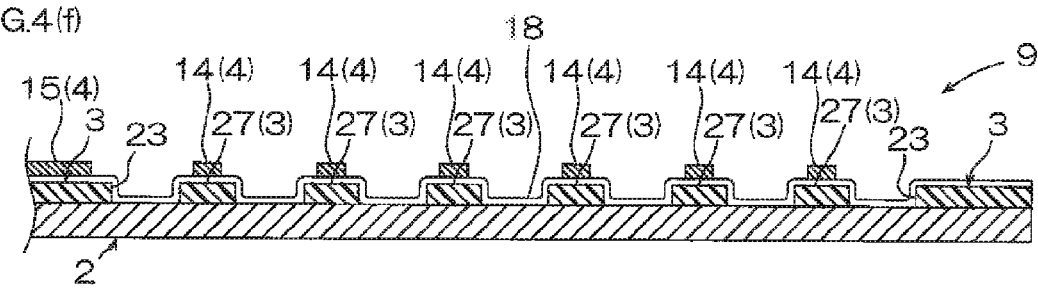
FIG.4(f)
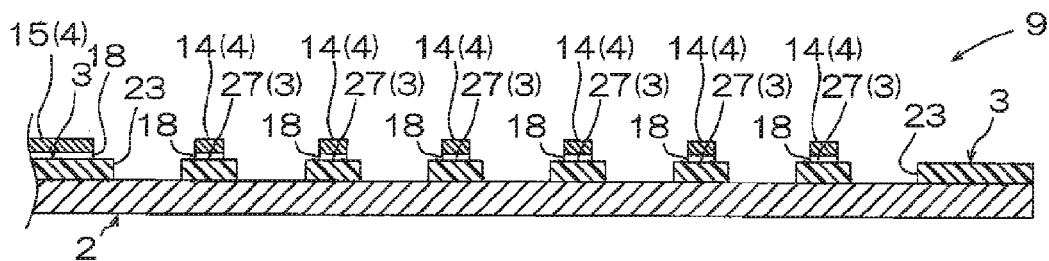
FIG.4(g)
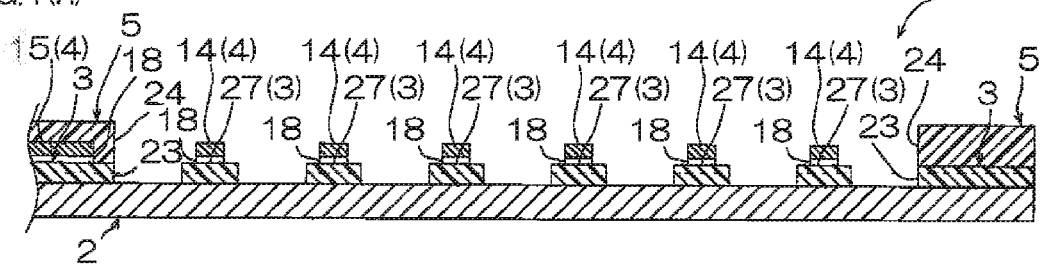
FIG.4(h)

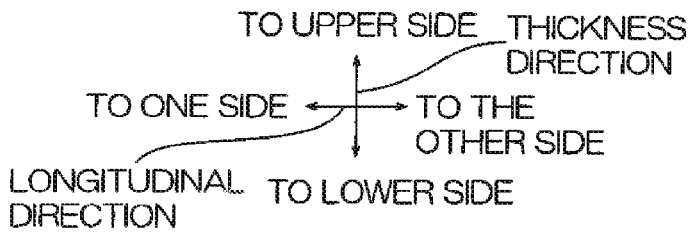
FIG.5(i)
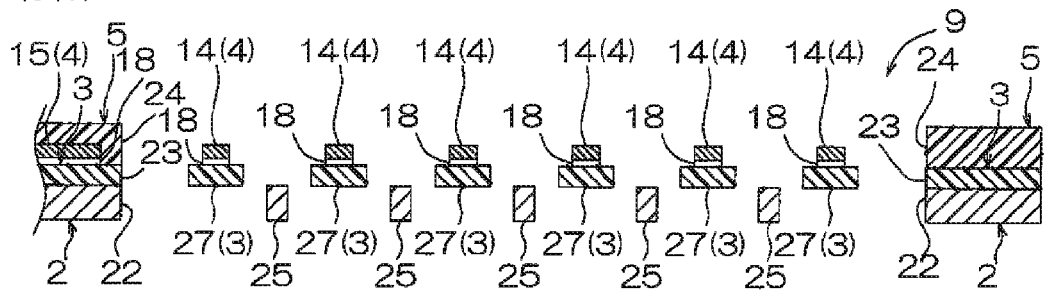
FIG.5(j)
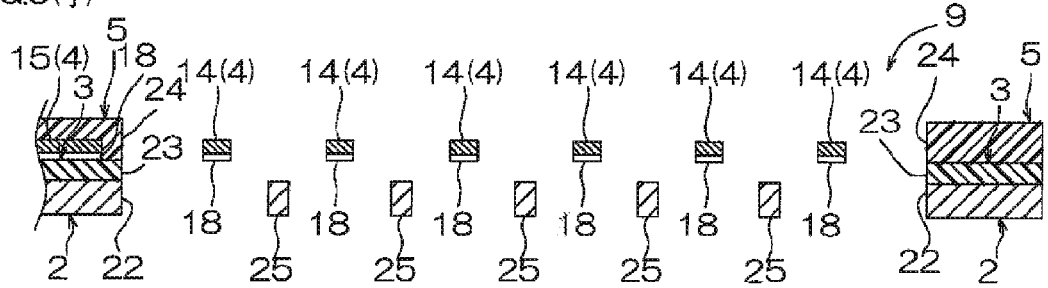
FIG.5(k)
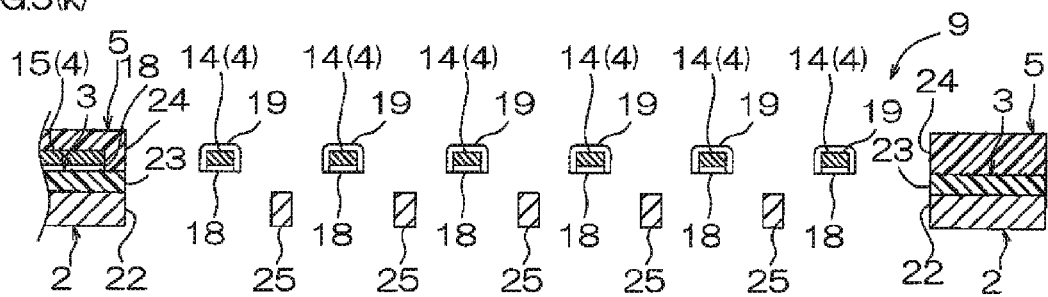
FIG.5(l)
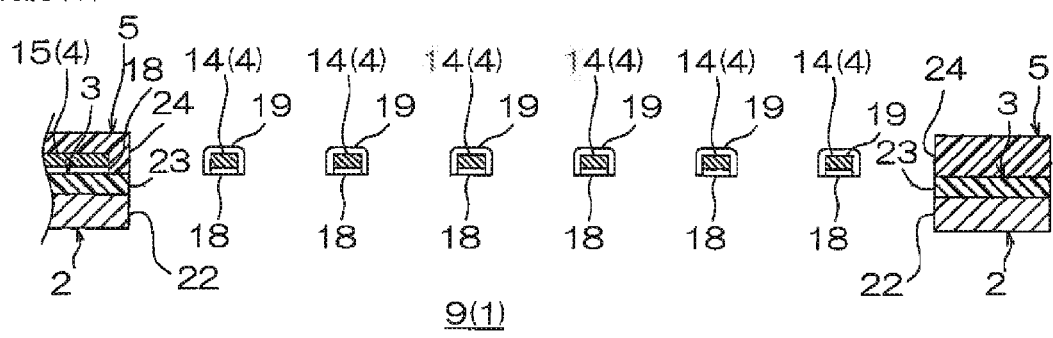

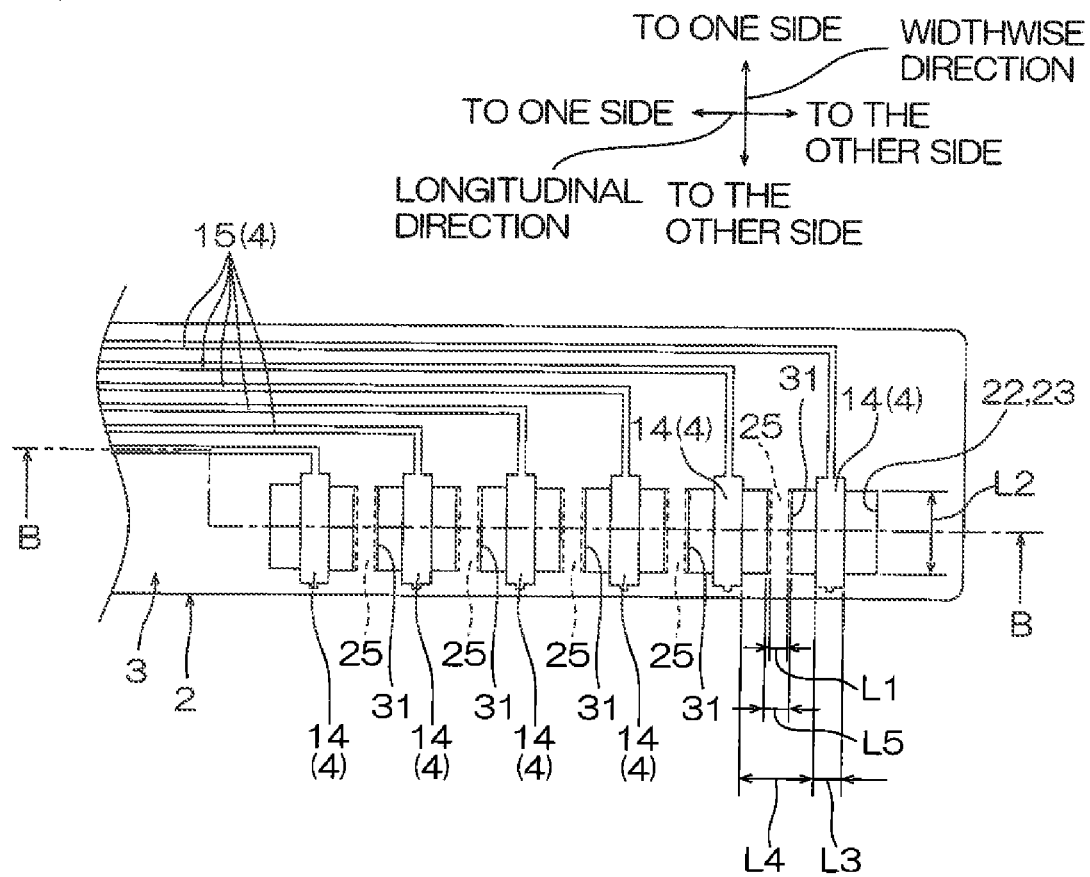

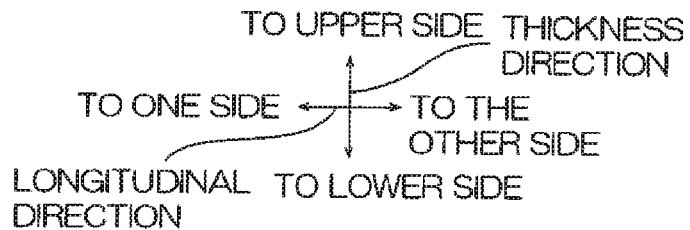
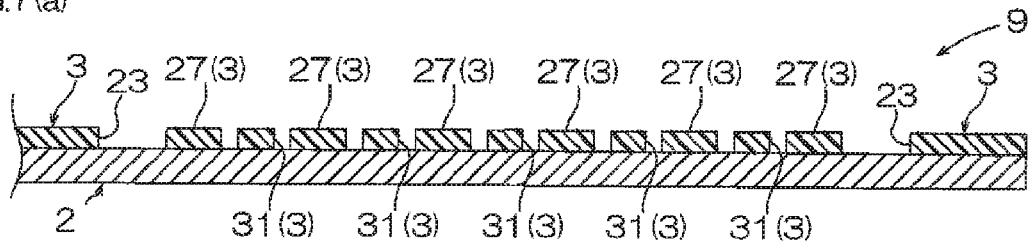
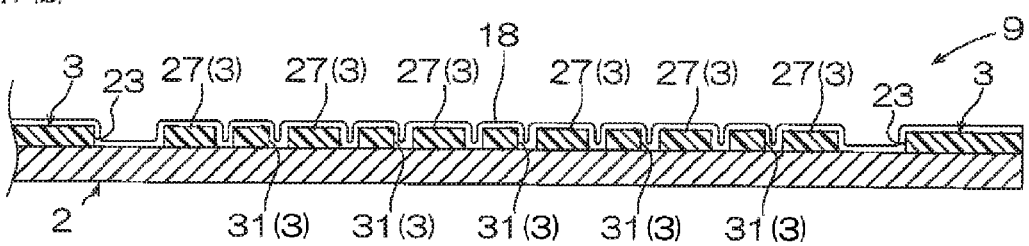
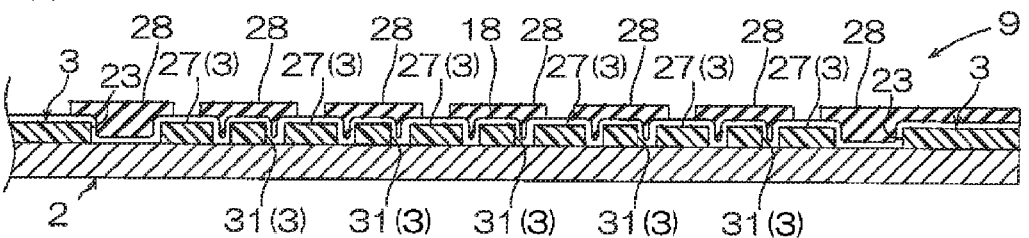
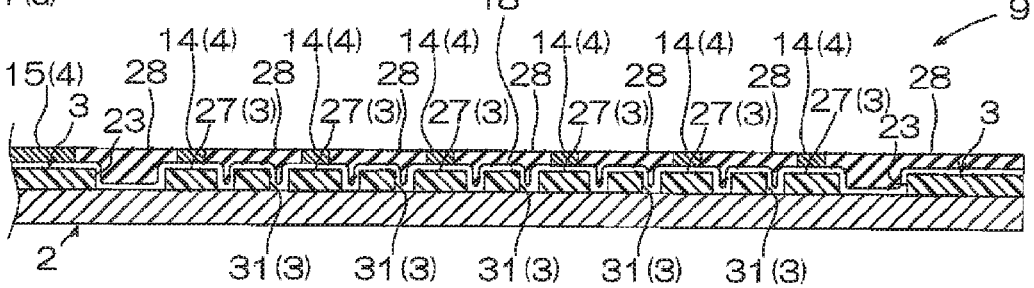

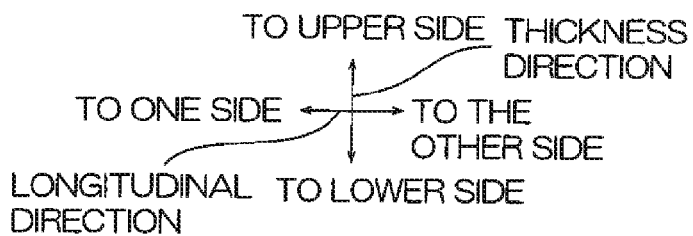
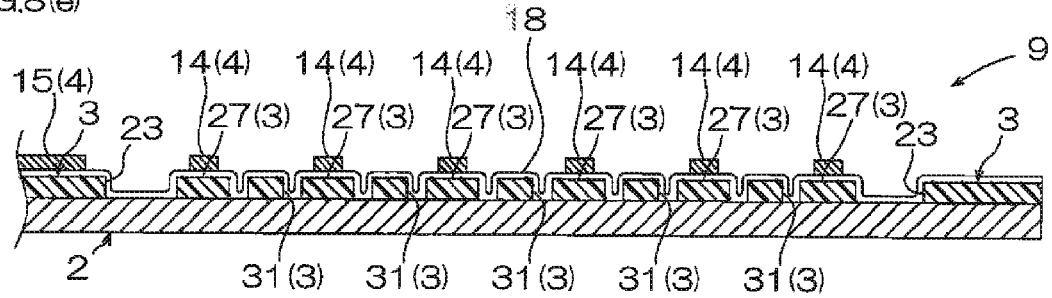
FIG.8(e)
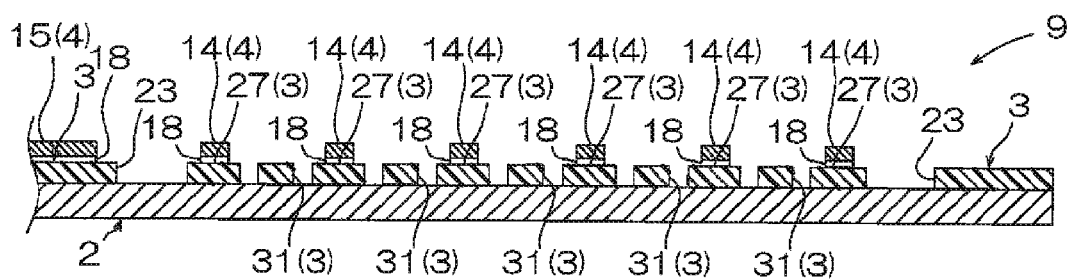
FIG.8(f)
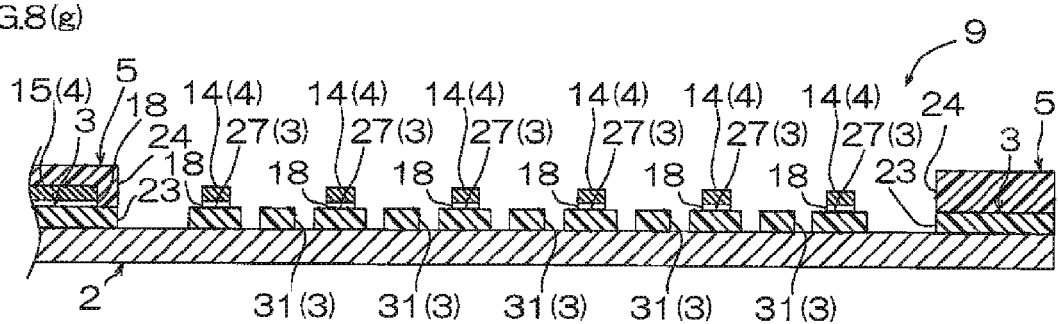
FIG.8(g)
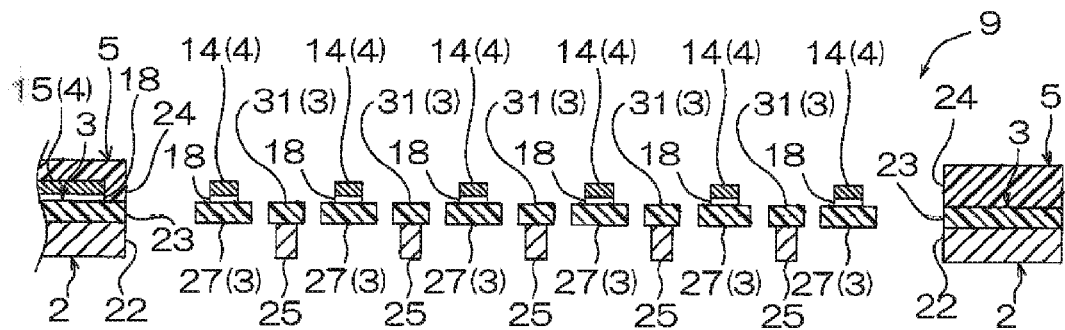
FIG.8(h)

METHOD OF PRODUCING A WIRED CIRCUIT BOARD

CROSS-REFERENCE TO RELATED APPLICATION

The present application claims priority from Japanese Patent Application No. 2012-257608 filed on Nov. 26, 2012 and Japanese Patent Application No. 2013-163772 filed on Aug. 7, 2013, the contents of which are herein incorporated by reference into this application.

BACKGROUND OF THE INVENTION

1. Field of the Invention

The present invention relates to a wired circuit board and a producing method thereof, and particularly to a wired circuit board used preferably as a suspension board with circuit and a producing method thereof.

2. Description of the Related Art

A wired circuit board used for electronic/electric equipment or the like is typically formed with a terminal portion to be connected to an external terminal.

In recent years, to respond to the increase in the density of electronic/electric equipment and the reduction in the size thereof, a flying lead having a terminal portion formed not only on one surface of a conductive pattern, but also on each of the both surfaces thereof has become prevalent. For example, it has been known that, in a suspension board with circuit used in a hard disk drive or the like, a terminal portion is formed as a flying lead.

For example, a suspension board with circuit has been known which includes a supporting board, a base layer formed on the supporting board, a conductive pattern formed as a predetermined wired circuit pattern on the base layer, and a cover layer covering the conductive pattern. In the suspension board with circuit, an opening is formed in the cover layer to expose the top surface of the conductive pattern, while an opening is formed in the supporting board and the base layer to expose the back surface of the conductive pattern, so that the conductive pattern the both surfaces of which are exposed is used as a flying lead (see, e.g., Japanese Unexamined Patent No. 2003-031915).

In such a suspension board with circuit, protruding portions are provided to protrude from the insulating layers to the surfaces of the flying lead and the flying lead is provided with a wider portion to inhibit the flying lead from being disconnected due to ultrasonic vibration when the flying lead is connected to an external terminal or the like.

SUMMARY OF THE INVENTION

In the suspension board with circuit described in Japanese Unexamined Patent No. 2003-031915 mentioned above, when the flying lead is to be connected to the external terminal, it is possible to inhibit the flying lead from being disconnected. However, since the flying lead independently exists in an opening, when an external force acts on the flying lead before and after the production of the suspension board with circuit, the problem of warpage or breakage of the flying lead occurs.

It is therefore an object of the present invention to provide a wired circuit board and a producing method thereof which can suppress the occurrence of warpage or breakage of each of terminal portions before and after the production of the wired circuit board.

A method of producing a wired circuit board of the present invention includes a first step of preparing a metal supporting layer, a second step of forming, on one side of the metal supporting layer in a thickness direction thereof, an insulating layer having a first opening, and a plurality of terminal formation portions placed in the first opening to be spaced apart from each other, a third step of forming, on one side of the insulating layer in the thickness direction, a conductive layer having a plurality of terminal portions each corresponding to the plurality of terminal formation portions, a fourth step of partially removing the metal supporting layer to form a second opening which includes the plurality of terminal formation portions when projected in the thickness direction, and at least one reinforcing metal supporting portion placed between the plurality of terminal formation portions in the second opening, and a fifth step of removing the plurality of terminal formation portions exposed from the second opening to expose both side surfaces of the plurality of terminal portions in the thickness direction.

In such a method of producing a wired circuit board, when the metal supporting layer is partially removed, the second opening is formed and also the at least one reinforcing metal supporting portion is placed between the plurality of terminal portions.

This allows the second opening of the metal supporting layer to be reinforced by the at least one reinforcing metal supporting portion. Therefore, even when impact or vibration is applied to a wired circuit board in the production steps including and subsequent to the fifth step, it is possible to protect the plurality of terminal portions with the reinforcing metal supporting portion placed between the plurality of terminal portions.

As a result, it is possible to suppress warpage or breakage of the terminal portions and after the production of the wired circuit board.

It is preferable that the method of producing a wired circuit board of the present invention further includes, after the fifth step, the step of removing the reinforcing metal supporting portion.

In such a method of producing a wired circuit board, it is possible to protect the terminal portions with the reinforcing metal supporting portion. In addition, by removing the reinforcing metal supporting portion, it is also possible to locate only the terminal portions in the first opening and the second opening when the wired circuit board is projected in the thickness direction.

In the method of producing a wired circuit board of the present invention, it is preferable that, in the second step, the insulating layer is formed to further have, in the first opening, a reinforcing insulating portion which overlaps the reinforcing metal supporting portion when projected in the thickness direction.

Such a method of producing a wired circuit board allows the second opening of the metal supporting layer to be reinforced by the at least one reinforcing metal supporting portion and also allows the first opening of the insulating layer to be reinforced by the reinforcing insulating portion.

Therefore, even when impact or vibration is applied to the wired circuit board, it is possible to reliably protect the plurality of terminal portions with the reinforcing metal supporting portion and the reinforcing insulating portion which are placed between the plurality of terminal portions.

As a result, it is possible to more reliably suppress warpage or breakage of the terminal portions before and after the production of the wired circuit board.

It is preferable that the method of producing a wired circuit board of the present invention further includes the step of removing the reinforcing insulating portion.

In such a method of producing a wired circuit board, it is possible to protect the terminal portions with the reinforcing insulating portion. In addition, by removing the reinforcing insulating portion, it is also possible to locate only the terminal portions in the first opening and the second opening when the wired circuit board is projected in the thickness direction.

In the method of producing a wired circuit board of the present invention, it is preferable that a length of the reinforcing insulating portion in a direction in which the plurality of terminal portions are adjacent to each other is in a range of 10% to 100% of a distance between the plurality of terminal portions.

In such a method of producing a wired circuit board, it is possible to protect the terminal portions with the reinforcing insulating portion and also reliably expose both of the one surface and the other surface of each of the terminal portions in the thickness direction.

Therefore, it is possible to suppress warpage or breakage of the terminal portions before and after the production of the wired circuit board and also reliably provide connection between each of the terminal portions and an external terminal.

In the method of producing a wired circuit board of the present invention, it is preferable that a length of the reinforcing metal supporting portion in a direction in which the plurality of terminal portions are adjacent to each other is in a range of 10% to 100% of a distance between the plurality of terminal portions.

In such a method of producing a wired circuit board, it is possible to protect the terminal portions with the reinforcing metal supporting portion and also reliably expose both of the one surface and the other surface of each of the terminal portions in the thickness direction.

Therefore, it is possible to suppress warpage or breakage of the terminal portions before and after the production of the wired circuit board and also reliably provide connection between each of the terminal portions and the external terminal.

A wired circuit board of the present invention includes a metal supporting layer, an insulating layer formed on one side of the metal supporting layer in a thickness direction thereof, and a conductive layer having a plurality of terminal portions placed to be spaced apart from each other and formed on one side of the insulating layer in the thickness direction, wherein the insulating layer has a first opening which is formed to include the plurality of terminal portions when projected in the thickness direction, and the metal supporting layer includes a second opening which is formed to include the plurality of terminal portions when projected in the thickness direction. The wired circuit board of the present invention further includes at least one reinforcing insulating portion which is placed between the plurality of terminal portions in the first opening when projected in the thickness direction and/or at least one reinforcing metal supporting portion which is placed between the plurality of terminal portions in the second opening when projected in the thickness direction.

Such a wired circuit board allows the first opening of the insulating layer and/or the second opening of the metal supporting layer to be reinforced by the at least one reinforcing insulating portion and/or the at least one reinforcing metal supporting portion. Therefore, even when impact or vibration is applied to the wired circuit board, it is possible to protect the plurality of terminal portions.

As a result, it is possible to suppress warpage or breakage of the terminal portions.

In the wired circuit board of the present invention, it is preferable that both of the reinforcing insulating portion and the reinforcing metal supporting portion are included, and the reinforcing insulating portion and the reinforcing metal supporting portion overlap each other when projected in the thickness direction.

In such a wired circuit board, even when impact or vibration is applied to the wired circuit board, the reinforcing insulating portion and the reinforcing metal supporting portion overlap each other to be able to have high rigidity and allow the terminal portions to be more reliably protected.

Therefore, it is possible to more reliably suppress warpage or breakage of the terminal portions than in the case where only either one of the reinforcing insulating portion and the reinforcing metal supporting portion is formed.

In the wired circuit board of the present invention, it is preferable that a length of the reinforcing insulating portion in a direction in which the plurality of terminal portions are adjacent to each other is in a range of 10% to 100% of a distance between the plurality of terminal portions.

In such a wired circuit board, it is possible to protect the terminal portions with the reinforcing insulating portion and also reliably expose both of the one surface and the other surface of each of the terminal portions in the thickness direction.

Therefore, it is possible to suppress warpage or breakage of the terminal portions and also reliably provide connection between each of the terminal portions and an external terminal.

In the wired circuit board of the present invention, it is preferable that a length of the reinforcing metal supporting portion in a direction in which the plurality of terminal portions are adjacent to each other is in a range of 10% to 100% of a distance between the plurality of terminal portions.

In such a wired circuit board, it is possible to protect the terminal portions with the reinforcing metal supporting portion and also reliably expose both of the one surface and the other surface of each of the terminal portions in the thickness direction.

Therefore, it is possible to suppress warpage or breakage of the terminal portions and also reliably provide connection between each of the terminal portions and the external terminal.

BRIEF DESCRIPTION OF THE DRAWINGS

FIGS. 3(a)-3(d) are a process view illustrating a method of producing the suspension board with circuit shown in FIG. 1, which is a cross-sectional view along the line A-A of FIGS. 2(a) and 2(b), FIG. 3(a) showing the step of preparing a supporting board, FIG. 3(b) showing the step of forming an insulating base layer, FIG. 3(c) showing the step of forming a conductive thin film, and FIG. 3(d) showing the step of forming a plating resist;

FIGS. 4(e)-4(h) are a process view illustrating the method of producing the suspension board with circuit shown in FIG. 1, which is subsequent to FIGS. 3(a)-3(d), FIG. 4(e) showing the step of forming a conductive pattern, FIG. 4(f) showing the step of removing the plating resist, FIG. 4(g) showing the step of removing the conductive thin film exposed from the conductive pattern, and FIG. 4(h) showing the step of forming an insulating cover layer;

FIGS. 5(i)-5(l) are a process view illustrating the method of producing the suspension board with circuit shown in FIG. 1, which is subsequent to FIGS. 4(e)-4(h), FIG. 5(i) showing the step of partially removing the supporting board to form a supporting-board-side opening and reinforcing supporting portions, FIG. 5(j) showing the step of removing terminal formation portions exposed from the supporting-board-side opening, FIG. 5(k) showing the step of plating terminal portions, and FIG. 5(l) showing the step of removing the reinforcing supporting portions;

FIG. 6 is a plan view of the external connecting portion of the suspension board with circuit shown in FIG. 1, which shows a form in which the reinforcing supporting portions and reinforcing insulating portions are not removed;

FIGS. 7(a)-7(d) are a process view illustrating a method of producing the suspension board with circuit shown in FIG. 1, which is a cross-sectional view along the line B-B of FIG. 6, FIG. 7(a) showing the step of forming the insulating base layer having the reinforcing insulating portions, FIG. 7(b) showing the step of forming the conductive thin film, FIG. 7(c) showing the step of forming the plating resist, and FIG. 7(d) showing the step of forming the conductive pattern;

FIGS. 8(e)-8(h) are a process view illustrating the method of producing the suspension board with circuit shown in FIG. 1, which is subsequent to FIGS. 7(a)-7(d), FIG. 8(e) showing the step of removing the plating resist, FIG. 8(f) showing the step of removing the conductive thin film exposed from the conductive pattern, FIG. 8(g) showing the step of forming the insulating cover layer, and FIG. 8(h) showing the step of partially removing the supporting board to form the supporting-board-side opening and the reinforcing supporting portions;

DETAILED DESCRIPTION OF THE INVENTION

A suspension board with circuit mounts thereon a magnetic head (not shown) in a hard disk drive to support the magnetic head, while holding a minute gap between the magnetic head and a magnetic disk, against an air flow when the magnetic head and the magnetic disk travel relatively to each other. The suspension board with circuit is integrally formed with wires for connecting the magnetic head and a read/write board as an external circuit.

Figure 1:
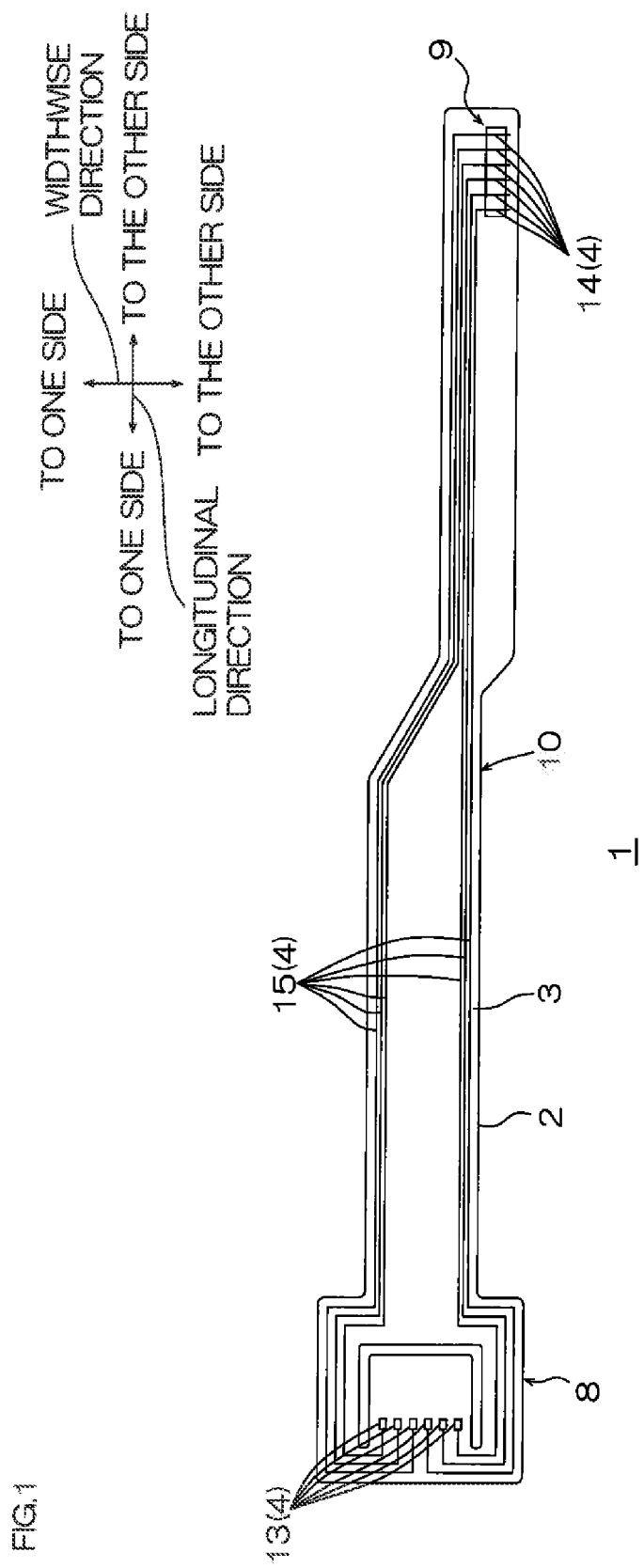
FIG. 1 is a plan view of a suspension board with circuit obtained in accordance with an embodiment of a producing method of a wired circuit board of the present invention.

Note that, in FIG. 1, the left side corresponds to one side of a suspension board with circuit 1 in the longitudinal direction (adjacent direction) thereof and the right side corresponds to the other side of the suspension board with circuit 1 in the longitudinal direction (adjacent direction) thereof. Also, in FIG. 1, the upper side corresponds to one side of the suspension board with circuit 1 in the widthwise direction thereof and the lower side corresponds to the other side of the suspension board with circuit 1 in the widthwise direction thereof. In FIGS. 3(a) to 5(l), the upper side corresponds to the upper side (one side in the thickness direction) of the suspension board with circuit 1 and the lower side corresponds to the lower side (the other side in the thickness direction) of the suspension board with circuit 1.

As shown in FIG. 1, the suspension board with circuit 1 is formed in a generally rectangular flat belt shape in plan view extending in the longitudinal direction. The suspension board with circuit 1 includes a slider mounting portion 8 which is disposed on the one longitudinal side thereof and on which a slider (not shown) including a magnetic head (not shown) is mounted, an external connecting portion 9 which is disposed on the other longitudinal side thereof and configured to be electrically connected to the read/write board (not shown) as an external board, and a wiring portion 10 extending in the longitudinal direction between the slider mounting portion 8 and the external connecting portion 9.

The suspension board with circuit 1 also includes a conductive pattern 4 as an example of a conductive layer.

The conductive pattern 4 includes a plurality of (six) head-side terminals 13, a plurality of (six) external-side terminals 14 as an example of terminal portions, and a plurality of (six) wires 15.

The plurality of head-side terminals 13 are arranged in parallel in the slider mounting portion 8 to be widthwise spaced (preferably equally spaced) apart from each other. The head-side terminals 13 are each formed in a generally rectangular shape (square land) in plan view. The head-side terminals 13 are electrically connected to the magnetic head (not shown) of the slider (not shown).

The plurality of external-side terminals 14 are arranged in parallel in the external connecting portion 9 to be longitudinally spaced apart from each other. The external-side terminals 14 are each formed in a generally rectangular shape (square land) in plan view (see FIGS. 2(a) and 2(b)). The external-side terminals 14 are electrically connected to the read/write board (not shown).

The plurality of wires 15 are provided so as to connect the plurality of head-side terminals 13 and the plurality of external-side terminals 14. Specifically, the plurality of wires 15 are arranged in parallel in the wiring portion 10 to be widthwise spaced apart from each other and formed to extend in the longitudinal direction. In the slider mounting portion 8, each of the wires 15 protrudes outwardly on both widthwise sides to extend toward the one longitudinal side. Then, the wire 15 extends widthwise inwardly to be turned back toward the other longitudinal side so that one end portion thereof is connected to the head-side terminal 13. In the external connecting portion 9, each of the wires 15 is bent toward the other widthwise side so that the other end portion thereof is connected to the external-side terminal 14. Note that the wire 15 is formed to have a width smaller than that of each of the head-side terminals 13 and the external-side terminals 14.

As shown in FIGS. 1 and 5(l), the suspension board with circuit 1 includes a supporting board 2 as an example of a metal supporting layer extending in the longitudinal direction, an insulating base layer 3 as an example of an insulating layer laminated on the upper surface of the supporting board 2, the conductive pattern 4 laminated on the upper surface of the insulating base layer 3, and an insulating cover layer 5 (omitted in FIGS. 1, 2(a), 2(b), and 6 and shown in FIGS. 5(i)-5(l) and 9(i)-9(l)) laminated on the upper surface of the insulating base layer 3 so as to cover the conductive pattern 4.

Figure 2A:
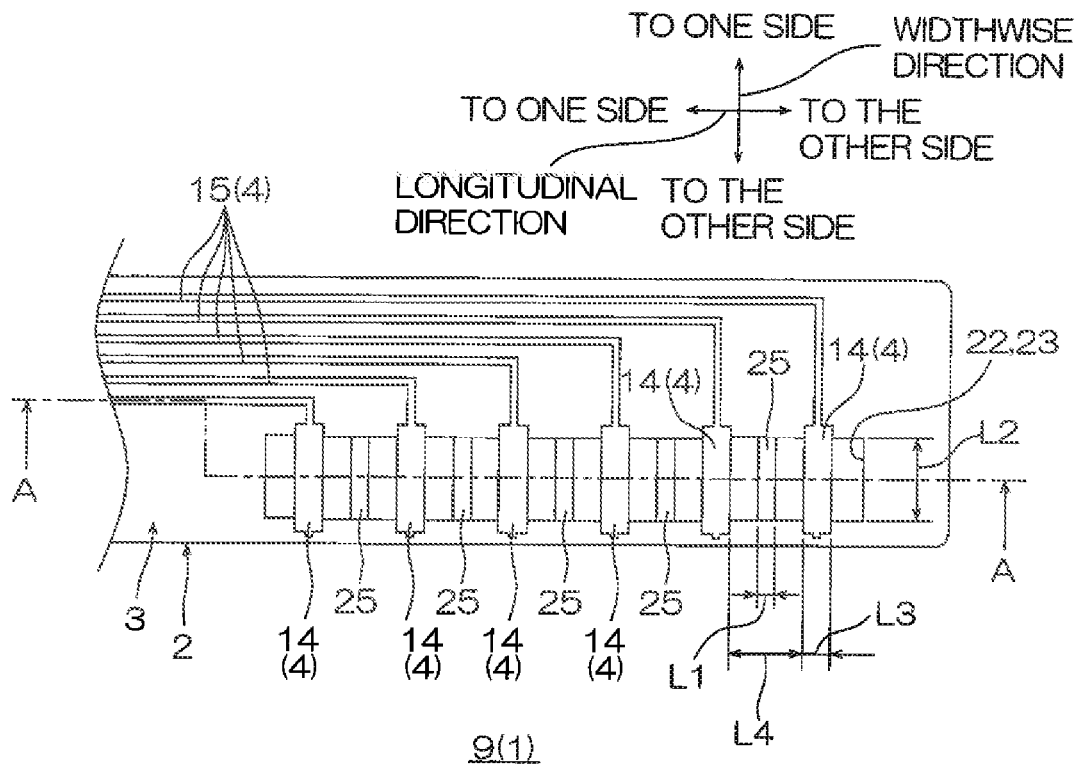
FIGS. 2(a) and 2(b) are a plan view of the external connecting portion of the suspension board with circuit shown in FIG. 1, FIG. 2(a) showing a form in which a reinforcing supporting portion is not removed, and FIG. 2(b) showing a form in which the reinforcing supporting portion is removed.
Figure 2B:
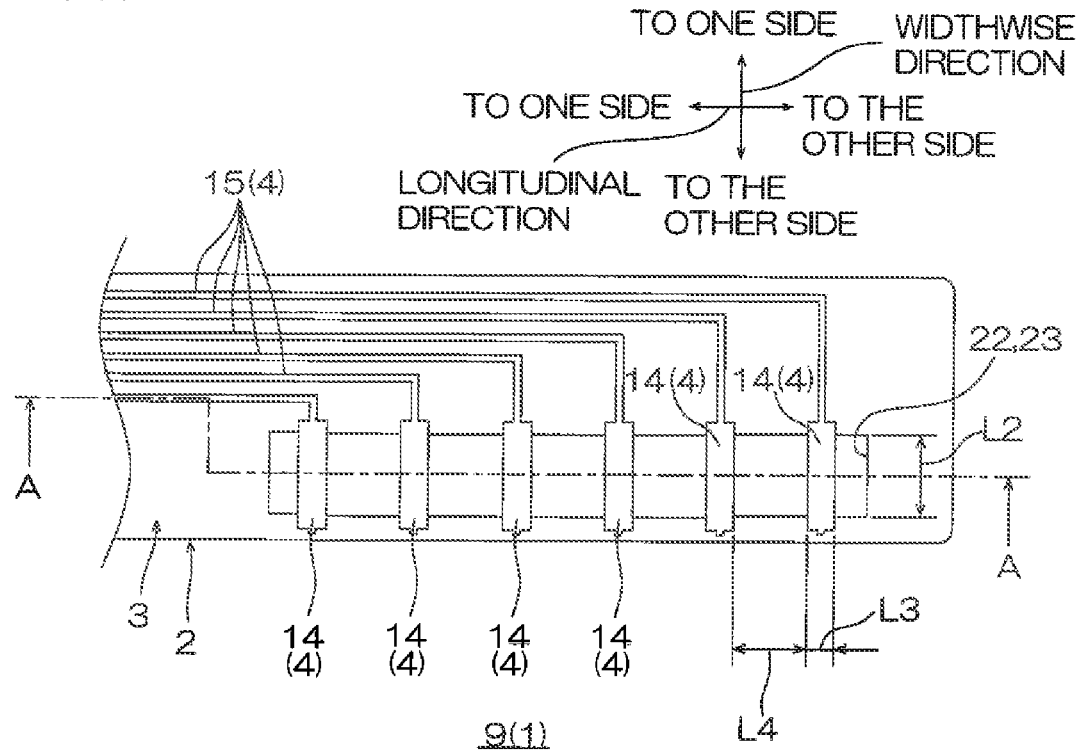

In the external connecting portion 9, the supporting board 2 is formed with a supporting-board-side opening 22 as an example of a second opening, as shown in FIGS. 2(b) and 5(l).

The supporting-board-side opening 22 is formed in a generally rectangular shape in plan view extending through the supporting board 2 in the thickness direction to include the plurality of external-side terminals 14 when projected in the thickness direction. Specifically, the supporting-board-side opening 22 is formed such that, in plan view, the both widthwise end edges thereof are located widthwise internally of the both widthwise end edges of the external-side terminals 14. The supporting-board-side opening 22 is also formed such that, in plan view, when the inner side and the outer side are assumed to respectively correspond to the one side and the other side, the one longitudinal end edge thereof is located on the one longitudinal side of the longitudinally innermost external-side terminal 14 and the other longitudinal end edge thereof is located on the other longitudinal side of the longitudinally outermost external-side terminal 14.

In the external connecting portion 9, a base-side opening 23 as an example of a first opening is formed in the insulating base layer 3 to correspond to the supporting-board-side opening 22 and a cover-side opening 24 is formed in the insulating cover layer 5 to correspond to the supporting-board-side opening 22. That is, when projected in the thickness direction, the base-side opening 23 and the cover-side opening 24 overlap the supporting-board-side opening 22.

Thus, the plurality of external-side terminals 14 are disposed such that the lower surfaces thereof are exposed from the supporting-board-side opening 22 and the base-side opening 23 and the upper surfaces thereof are exposed from the cover-side opening 24 to be configured as flying leads. The external-side terminals 14 have a conductive thin film 18 formed on each of the lower surfaces thereof and a plating layer 19 formed on each of the upper surfaces and both side surfaces thereof.

Note that, as shown in FIG. 2(a), there is a form of the suspension board with circuit 1 in which, in the external connecting portion 9, a plurality of (five) reinforcing supporting portions 25 each as an example of a reinforcing metal supporting portion are formed to remain without being removed, as is described later in detail.

The plurality of reinforcing supporting portions 25 are formed to connect the one widthwise side of the supporting-board-side opening 22 in the supporting board 2 to the other widthwise side thereof. The reinforcing supporting portions 25 are arranged to be longitudinally spaced (preferably equally spaced) apart from each other to be placed between the plurality of external-side terminals 14 when projected in the thickness direction. In other words, the plurality of reinforcing supporting portions 25 are disposed in the one supporting-board-side opening 22. That is, each of the plurality of reinforcing supporting portions 25 is disposed between the external-side terminals 14 adjacent to each other when projected in the thickness direction. This means that the plurality of reinforcing supporting portions 25 are alternately arranged with the plurality of external-side terminals 14 when projected in the thickness direction. Specifically, the reinforcing supporting portions 25 are disposed such that the longitudinal middle of each of the reinforcing supporting portions 25 coincides with a middle point between the external-side terminals 14 adjacent to each other.

The suspension board with circuit 1 described above allows the supporting-board-side opening 22 of the supporting board 2 to be reinforced by the plurality of reinforcing supporting portions 25. Therefore, even when impact or vibration is applied to the suspension board with circuit 1, the plurality of external-side terminals 14 can be protected.

As a result, it is possible to suppress warpage or breakage of the terminal portions 14.

As shown in FIG. 6, there is also a form of the suspension board with circuit 1 in which, in the external connecting portion 9, the plurality of (five) reinforcing supporting portions 25 and a plurality of (five) reinforcing insulating portions 31 are formed to remain without being removed, as is described later in detail.

The plurality of reinforcing supporting portions 25 are placed in the supporting-board-side opening 22 so as to alternate with the plurality of external-side terminals 14 when projected in the thickness direction (see FIG. 2(a)).

The plurality of reinforcing insulating portions 31 are formed to connect the one widthwise side of the base-side opening 23 to the other widthwise side thereof in the insulating base layer 3 and be laminated on the upper surfaces of the corresponding reinforcing supporting portions 25. The reinforcing insulating portions 31 are arranged to be longitudinally spaced (preferably equally spaced) apart from each other to be placed between the plurality of external-side terminals 14 when projected in the thickness direction. In other words, the plurality of reinforcing insulating portions 31 are disposed in the one base-side opening 23. That is, each of the plurality of reinforcing insulating portions 31 is disposed between the external-side terminals 14 adjacent to each other when projected in the thickness direction. This means that the plurality of reinforcing insulating portions 31 are alternately arranged with the plurality of external-side terminals 14 when projected in the thickness direction. Specifically, the reinforcing insulating portions 31 are disposed such that the longitudinal middle of each of the reinforcing insulating portions 31 coincides with the middle point between the external-side terminals 14 adjacent to each other.

In the suspension board with circuit 1 described above, the reinforcing insulating portions 31 and the reinforcing supporting portions 25 are disposed to overlap each other when projected in the thickness direction to be able to have high rigidity. As a result, even when impact or vibration is applied to the suspension board with circuit 1, the external-side terminals 14 can be protected more reliably.

Therefore, it is possible to more reliably suppress warpage or breakage of the terminal portions 14 than in the case where only either the reinforcing insulating portions 31 or the reinforcing supporting portions 25 are formed.

Next, a first method of producing the suspension board with circuit 1 in which the reinforcing supporting portions 25 are formed midway in the production process thereof is described with reference to FIGS. 3(a)-3(d), 4(e)-4(h), and 5(i)-5(l).

First, in the first producing method, as shown in FIG. 3(a), the supporting board 2 in a flat belt shape extending in the longitudinal direction is prepared (first step).

The supporting board 2 is formed of a metal material such as, e.g., stainless steel, a 42-alloy, aluminum, a copper-beryllium alloy, or phosphor bronze. Preferably, the supporting board 2 is formed of stainless steel.

Preferably, the supporting board 2 having a thickness in a range of, e.g., not less than 10 nm, or preferably not less than 15 μm and, e.g., not more than 50 μm, or preferably not more than 35 μm is used.

Next, in the method, as shown in FIG. 3(b), the insulating base layer 3 is formed on the portion of the upper surface of the supporting board 2 in which the conductive pattern 4 is to be formed. At this time, in the external connecting portion 9, the insulating base layer 3 is formed into a pattern formed with the base-side opening 23 which overlaps the supporting-board-side opening 22 when projected in the thickness direction and with a plurality of terminal formation portions 27 corresponding to the plurality of external-side terminals 14 (second step).

The plurality of terminal formation portions 27 are formed to connect the one widthwise side of the base-side opening 23 to the other widthwise side thereof in the insulating base layer 3 and arranged to be longitudinally spaced apart from each other. Note that the terminal formation portions 27 are removed after the plurality of external-side terminals 14 are formed on the upper surfaces thereof in the subsequent step.

The insulating base layer 3 is formed of a synthetic resin such as, e.g., polyimide, polyamide imide, acryl, polyether nitrile, polyether sulfone, polyethylene terephthalate (PET), polyethylene naphthalate, or polyvinyl chloride. Preferably, in terms of dimensional stability against heat, the insulating base layer 3 is preferably formed of polyimide.

To form the insulating base layer 3, e.g., a solution (varnish) of a photosensitive synthetic resin is applied to the upper surface of the supporting board 2 and dried to form a photosensitive base coating.

Then, the photosensitive base coating is exposed to light via a photomask not shown. The photomask includes a light blocking portion, and a light full transmitting portion in a pattern. The light full transmitting portion is positioned to face the portion of the base coating in which the insulating base layer 3 (including the plurality of terminal formation portions 27) is to be formed, and the light blocking portion is positioned to face the portion (i.e., the portion in which the base opening 23 is to be formed) of the base coating in which the insulating base layer 3 is not to be formed.

Then, the exposed base coating is developed and cured by heating.

As a result, the insulating base layer 3 is formed in the pattern formed with the base-side openings 23 and with the plurality of terminal formation portions 27.

The thickness of the insulating base layer 3 (including the plurality of terminal formation portions 27) thus formed is in a range of, e.g., not less than 1 μm, or preferably not less than 3 μm and, e.g., not more than 35 μm, or preferably not more than 15 μm.

The width (longitudinal length) of each of the plurality of terminal formation portions 27 is set to be equal to or larger than the width (longitudinal length which is assumed to be a width L3 (shown in FIGS. 2(a) and 2(b) and described later) of each of the external-side terminals 14) of each of the external-side terminals 14, or preferably not less than (L3+20) μm and, e.g., not more than (L3+200) μm, or preferably equal to (L3+100) Ξm.

Next, in the method, the conductive pattern 4 is formed on the upper surface of the insulating base layer 3 into the pattern formed with the head-side terminals 13, the external-side terminals 14, and the wires 15. At this time, in the external connecting portion 9, the plurality of external-side terminals 14 are individually formed on the respective upper surfaces of the plurality of terminal formation portions 27 of the insulating base layer 3.

To form the conductive pattern 4, the conductive pattern 4 is formed on the upper surface of the insulating base layer 3 by a known patterning method such as, e.g., a subtractive method or an additive method. Preferably, the additive method is used.

In the additive method, as shown in FIG. 3(c), the conductive thin film 18 is formed over the upper surface of the insulating base layer 3 and the upper surface of the supporting board 2 exposed from the base-side opening 23. Specifically, the conductive thin film 18 is formed continuously over the upper surface of the insulating base layer 3, the inner side surface of the base-side opening 23 of the insulating base layer 3, the upper surface of the supporting board 2 exposed from the base-side opening 23 of the insulating base layer 3, and the side surfaces and upper surfaces of the plurality of terminal formation portions 27 of the insulating base layer 3.

The conductive thin film 18 is formed of, e.g., chromium, copper, or the like.

For the formation of the conductive thin film 18, a vacuum vapor deposition method, particularly sputtering is preferably used. The conductive thin film 18 may also be a laminate of a plurality of the conductive thin films 18. Preferably, a chromium thin film is formed by sputtering. Note that the thickness of the chromium thin film is in a range of, e.g. not less than 100 Å and not more than 600 Å.

Next, as shown in FIG. 3(d), a plating resist 28 is formed on the upper surface of the conductive thin film 18 into a pattern reverse to the conductive pattern 4 (the head-side terminals 13, the external-side terminals 14, and the wires 15). At this time, in the external connecting portion 9, the plating resist 28 is formed on the upper surface of the conductive thin film 18 into a pattern reverse to that of the external-side terminals 14.

The plating resist 28 is formed in the resist pattern described above by a known method using, e.g., a dry film resist or the like.

Next, as shown in FIG. 4(e), the conductive pattern 4 (the head-side terminals 13, the external-side terminals 14, and the wires 15) is formed on the upper surface of the conductive thin film 18 exposed from the plating resist 28. At this time, the external-side terminals 14 are formed on the upper surface of the conductive thin film 18 (upper surfaces of the terminal formation portions 27) exposed from the plating resist 28 (third step).

The conductive pattern 4 is formed from a conductive material such as, e.g., copper, nickel, gold, a solder, or an alloy thereof. Preferably, the conductive pattern 4 is formed of copper.

The conductive pattern 4 is formed by plating. Plating may be either electrolytic plating or electroless plating, but electrolytic plating is used preferably. In particular, electrolytic copper plating is used preferably.

The thickness of the conductive pattern 4 thus formed is in a range of, e.g., not less than 3 μm, or preferably not less than 5 μm and, e.g., not more than 50 μm, or preferably not more than 20 μm.

The width (widthwise length) of each of the head-side terminals 13 is in a range of, e.g., not less than 20 μm, or preferably not less than 35 μm and, e.g., not more than 100 μm, or preferably not more than 80 μm.

The spacing between the plurality of head-side terminals 13 is in a range of, e.g., not less than 20 μm, or preferably not less than 30 μm and, e.g., not more than 100 μm, or preferably not more than 80 μm.

The width of each of the external-side terminals 14 (longitudinal length which is assumed to be the width L3 (see FIGS. 2(a) and 2(b)) of the external-side terminal 14) is in a range of, e.g., not less than 100 μm, or preferably not less than 150 μm and, e.g., not more than 400 μm, or preferably not more than 300 μm.

The spacing between the plurality of external-side terminals 14 (which is assumed to be a distance L4 (see FIGS. 2(a) and 2(b)) between the external-side terminals 14) is in a range of, e.g., not less than 30 μm, or preferably not less than 50 μm and, e.g., not more than 800 μm, or preferably not more than 600 μm.

The width (widthwise length) of each of the wires 15 is in a range of, e.g., not less than 8 nm, or preferably not less than 10 μm and, e.g., not more than 250 μm, or preferably not more than 200 μm.

The spacing between the plurality of wires 15 is in a range of, e.g., not less than 8 μm, or preferably not less than 10 μm and, e.g., not more than 250 μm, or preferably not more than 200 nm.

Next, as shown in FIG. 4(f), the plating resist 28 is removed by, e.g., etching, peeling, or the like.

Next, as shown in FIG. 4(g), the conductive thin film 18 exposed from the conductive pattern 4 (the head-side terminals 13, the external-side terminals 14, and the wires 15) is removed by a known etching method such as, e.g., wet etching (e.g., chemical etching).

As a result, the conductive pattern 4 (the head-side terminals 13, the external-side terminals 14, and the wires 15) is formed on the upper surface of the conductive thin film 18.

Next, as shown in FIG. 4(h), the insulating cover layer 5 is formed on the upper surface of the insulating base layer 3 so as to cover the wires 15 and expose the head-side terminals 13 and the external-side terminals 14. At this time, in the external connecting portion 9, the insulating cover layer 5 is formed in a pattern formed with the cover-side opening 24.

The insulating cover layer 5 is formed of the same synthetic resin as that of the insulating base layer 3. Preferably, the insulating cover layer 5 is formed of polyimide.

To form the insulating cover layer 5, e.g., a photosensitive synthetic resin (varnish) is applied to the upper surface of the insulating base layer 3 including the wires 15 to form a photosensitive cover coating. Then, in the same manner as for the insulating base layer 3, the photosensitive cover coating is exposed to light via a photomask not shown, developed, and cured by heating.

Thus, the insulating cover layer 5 is formed in a pattern covering the wires 15 and exposing the head-side terminals 13 and the external-side terminals 14, e.g., in which the cover-side opening 24 is formed in the external connecting portion 9.

The thickness of the insulating cover layer 5 thus formed is in a range of, e.g., not less than 1 μm, or preferably not less than 2 μm.

Next, as shown in FIG. 5(i), in the external connecting portion 9, the supporting board 2 is partially removed to be formed with the supporting-board-side opening 22 and the reinforcing supporting portions 25 (fourth step).

To form the supporting-board-side opening 22 and the reinforcing supporting portions 25, for example, an etching method such as dry etching (e.g., plasma etching) or wet etching (e.g., chemical etching), drilling perforation, laser processing, or the like is used. Preferably, wet etching is used.

Thus, the supporting board 2 is processed into a pattern formed with the supporting-board-side opening 22 and the reinforcing supporting portions 25.

The supporting-board-side opening 22 thus formed has a longitudinal length which is in a range of, e.g., not less than 4000 μm, or preferably not less than 5500 μm and, e.g., not more than 20000 μm, or preferably not more than 10000 μm, and a widthwise length (assumed to be a width L2 (see FIGS. 2(a) and 2(b)) of the supporting-board-side opening 22) which is in a range of, e.g., not less than 50 μm, or preferably not less than 100 μm and, e.g., not more than 3000 μm, or preferably not more than 2000 μm.

Each of the reinforcing supporting portions 25 thus formed has a width (longitudinal length which is assumed to be a width L1 (see FIGS. 2(a) and 2(b)) of the reinforcing supporting portion 25) which is in a range of, e.g., not less than 10%, or preferably not less than 30% of the distance L4 between the external-side terminals 14 and, e.g., not more than 100%, or preferably not more than 90% thereof. Specifically, the reinforcing supporting portion 25 is formed to have a width which is in a range of, e.g., not less than 30 μm, or preferably not less than 50 μm and, e.g., not more than 800 μm, or preferably not more than 600 μm. The reinforcing supporting portion 25 has a length (widthwise length) which is in a range of, e.g., not less than 50 μm, or preferably not less than 100 μm and, e.g., not more than 3000 μm, or preferably not more than 2000 μm.

The spacing between the plurality of reinforcing supporting portions 25 is in a range of, e.g., not less than 100 μm, or preferably not less than 200 μm and, e.g., not more than 600 μm, or preferably not more than 400 μm.

Next, as shown in FIG. 5(j), the plurality of terminal formation portions 27 of the insulating base layer 3 exposed from the supporting-board-side opening 22 are removed by an etching method such as wet etching (e.g., chemical etching) (fifth step).

Note that, in the wet etching, the supporting board 2 serves as an etching resist to block the wet etching of the portion of the insulating base layer 3 other than the terminal formation portions 27.

As a result, the plurality of external-side terminals 14 have the upper surfaces thereof exposed from the cover-side opening 24 and the lower surfaces thereof (i.e., the lower surface of the conductive thin film 18 formed on the lower surface of each of the external-side terminals 14) exposed from the base-side opening 23 and the cover-side opening 24 to be configured as the flying leads.

Next, as shown in FIG. 5(k), the plating layer 19 is formed over the upper surface and both side surfaces of each of the external-side terminals 14.

The plating layer 19 is formed of, e.g., nickel, gold, or the like.

To form the plating layer 19, either an electrolytic plating method or an electroless plating method may be used. Preferably, electrolytic plating is used. The plating layer 19 may be a laminate of a plurality of the plating layers 19. Preferably, a nickel plating layer and a gold plating layer are successively formed by electrolytic nickel plating and electrolytic gold plating.

The thickness of the plating layer 19 thus formed (the thickness of the nickel plating layer and the gold plating layer) is in a range of, e.g., not less than 0.05 μm, or preferably not less than 0.1 μm and, e.g., not more than 5 μm, or preferably not more than 3 μm.

Then, as shown in FIG. 5(l), the reinforcing supporting portions 25 are removed, while the supporting board 2 is simultaneously trimmed. To remove the reinforcing supporting portions 25 and simultaneously trim the supporting board 2, for example, an etching method such as dry etching (e.g., plasma etching) or wet etching (e.g., chemical etching), drilling perforation, laser processing, or the like is used. Preferably, wet etching is used.

Next, the supporting board 2 is cleaned with a cleaning solvent such as, e.g., water, methanol, or acetone and subjected to an electrical inspection and an outer appearance inspection.

In this manner, the suspension board with circuit 1 is obtained.

In such a producing method of the suspension board with circuit 1, when the supporting board 2 is partially removed, the supporting-board-side opening 22 is formed, while the plurality of reinforcing supporting portions 25 are placed between the adjacent external-side terminals 14 so as to alternate with the external-side terminals 14, as shown in FIGS. 5(*i*)-5(*l*).

This allows the supporting-board-side opening 22 of the supporting substrate 2 to be reinforced with the plurality of reinforcing supporting portions 25. As a result, even when impact or vibration is applied to the suspension board with circuit 1 in the subsequent steps, i.e., the step (fifth step) of removing the plurality of terminal formation portions 27 of the insulating base layer 3 exposed from the supporting-board-side opening 22 by an etching method such as wet etching and the step of forming the plating layer 19 over the upper surface and both side surfaces of each of the external-side terminals 14, the plurality of external-side terminals 14 can be protected with the reinforcing supporting portions 25 each placed between the plurality of external-side terminals 14.

Consequently, in the production process of the suspension board with circuit 1, it is possible to suppress warpage or breakage of the external-side terminals 14 configured as the flying leads.

Thus, in such a producing method of the suspension board with circuit 1, in the step (fifth step) of removing the plurality of terminal formation portions 27 of the insulating base layer 3 exposed from the supporting-board-side opening 22 by an etching method such as wet etching and the step of forming the plating layer 19 over the upper surface and side surfaces of each of the external-side terminals 14, it is possible to protect the external-side terminals 14 with the reinforcing supporting portions 25. In addition, by removing the plurality of reinforcing supporting portions 25, it is also possible to locate only the external-side terminals 14 in the base-side opening 23 and the supporting-board-side opening 22 when the suspension board with circuit 1 is projected in the thickness direction.

Also, in the producing method of the suspension board with circuit 1 of the present invention, since the width L1 of each of the reinforcing supporting portions 25 is within the range shown above relative to the distance L4 between the external-side terminals 14, it is possible to protect the external-side terminals 14 with the reinforcing supporting portions 25 and also reliably expose both one surface and the other surface of each of the external-side terminals 14 in the thickness direction.

Therefore, in the production process of the suspension board with circuit 1, it is possible to suppress warpage or breakage of the terminal portions 14 and also reliably provide connection between each of the external-side terminals 14 and the external read/write board (not shown).

Next, a second method of producing the suspension board with circuit 1 in which the reinforcing supporting portions 25 and the reinforcing insulating portions 31 are formed midway in the production process thereof is described with reference to FIGS. 3(*a*)-3(*d*), 7(*a*)-7(*d*), 8(*e*)-8(*h*), and 9(*i*)-9(*l*). Note that, in the producing method of the suspension board with circuit 1 shown in FIGS. 7(*a*)-7(*d*), 8(*e*)-8(*h*), and 9(*i*)-9(*l*), a description of the same portions as those of the producing method (hereinafter referred to as the foregoing producing method) of the suspension board with circuit 1 shown in FIGS. 3(*a*)-3(*d*), 4(*e*)-4(*h*), and 5(*i*)-5(*l*) is omitted.

First, in the second producing method, as shown in FIG. 3(*a*), the supporting board 2 in a flat belt shape extending in the longitudinal direction is prepared (first step).

Next, as shown in FIG. 7(*a*), the insulating base layer 3 is formed on the upper surface of the supporting board 2 into a pattern formed with the base-side opening 23 which overlaps the supporting-board-side opening 22 when projected in the thickness direction, with the plurality of terminal formation portions 27 corresponding to the plurality of external-side terminals 14, and with the plurality of reinforcing insulating portions 31 corresponding to the plurality of reinforcing supporting portions 25 (second step).

More specifically, the plurality of terminal formation portions 27 are formed in the same pattern as in the foregoing producing method. Each of the plurality of reinforcing insulating portions 31 is formed to connect the one widthwise side of the base-side opening 23 to the other widthwise side thereof in the insulating base layer 3 and placed between the plurality of adjacent terminal formation portions 27. That is, the plurality of reinforcing insulating portions 31 are arranged to be longitudinally spaced apart from each other. Note that the reinforcing insulating portions 31 are removed in the subsequent step after the plurality of reinforcing supporting portions 25 are removed.

The thickness of each of the plurality of reinforcing insulating portions 31 thus formed is the same as that of each of the terminal formation portions 27. That is, the thickness of each of the plurality of reinforcing insulating portions 31 is in a range of, e.g., not less than 1 μm, or preferably not less than 3 μm and, e.g., not more than 35 μm, or preferably not more than 15 μm.

Each of the reinforcing insulating portions 31 has a width (longitudinal length which is assumed to be a width L5 (see FIG. 6) of the reinforcing insulating portion 31) which is in a range of, e.g., not less than 10%, or preferably not less than 30% of the distance L4 between the external-side terminals 14 and, e.g., not more than 100%, or preferably not more than 90% thereof. Specifically, the reinforcing insulating portion 31 is formed to have a width which is in a range of, e.g., not less than 30 μm, or preferably not less than 50 μm and, e.g., not more than 800 μm, or preferably not more than 600 μm. The reinforcing insulating portion 31 has a length (widthwise length) which is in a range of, e.g., not less than 50 μm, or preferably not less than 100 μm and, e.g., not more than 3000 μm, or preferably not more than 2000 μm.

The spacing between the plurality of reinforcing insulating portions 31 is in a range of, e.g., not less than 100 μm, or preferably not less than 200 μm and, e.g., not more than 600 μm, or preferably not more than 400 μm.

Next, as shown in FIG. 7(*b*), the conductive thin film 18 is formed over the upper surface of the insulating base layer 3 and the upper surface of the supporting board 2 exposed from the base-side opening 23.

Next, as shown in FIG. 7(*c*), the plating resist 28 is formed on the upper surface of the conductive thin film 18 into a pattern reverse to the conductive pattern 4 (the head-side terminals 13, the external-side terminals 14, and the wires 15). Note that, since the conductive pattern 4 is not formed on the upper surface of each of the plurality of reinforcing insulating portions 31, the plating resist 28 is formed so as to cover the entire reinforcing insulating portion 31.

Next, as shown in FIG. 7(*d*), the conductive pattern 4 (the head-side terminals 13, the external-side terminals 14, and the wires 15) is formed on the upper surface of the conductive thin film 18 exposed from the plating resist 28. At this time, the external-side terminals 14 are formed on the upper surface (the upper surface of each of the terminal formation portions 27) of the conductive thin film 18 exposed from the plating resist 28 (third step).

Next, as shown in FIG. 8(e), the plating resist 28 is removed by, e.g., etching, peeling, or the like.

Next, as shown in FIG. 8(f), the conductive thin film 18 exposed from the conductive pattern 4 (the head-side terminals 13, the external-side terminals 14, and the wires 15) is removed.

Next, as shown in FIG. 8(g), the insulating cover layer 5 is formed on the upper surface of the insulating base layer 3 so as to cover the wires 15 and expose the head-side terminals 13, the external-side terminals 14, and the reinforcing insulating portions 31.

Next, as shown in FIG. 8(h), in the external connecting portion 9, the supporting board 2 is partially removed to be formed with the supporting-board-side opening 22 and the reinforcing supporting portions 25 (fourth step).

Figure 9I:
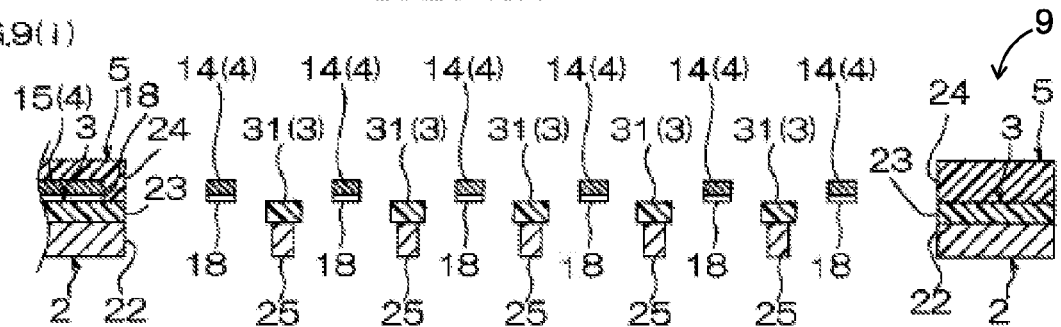
FIGS. 9(i)-9(l) are a process view illustrating the method of producing the suspension board with circuit shown in FIG. 1, which is subsequent to FIGS. 8(e)-8(h), FIG. 9(i) showing the step of removing the terminal formation portions exposed from the supporting-board-side opening, FIG. 9(j) showing the step of plating the terminal portions, FIG. 9(k) showing the step of removing the reinforcing supporting portions, and FIG. 9(l) showing the step of removing the reinforcing insulating portions.

Next, as shown in FIG. 9(i), the plurality of terminal formation portions 27 of the insulating base layer 3 exposed from the supporting-board-side opening 22 are removed (fifth step).

As a result, the plurality of external-side terminals 14 have the upper surfaces thereof exposed from the cover-side opening 24 and the lower surfaces thereof (i.e., the lower surface of the conductive thin film 18 formed on the lower surface of each of the external-side terminals 14) exposed from the base-side opening 23 and the cover-side opening 24 to be configured as the flying leads.

Figure 9J:
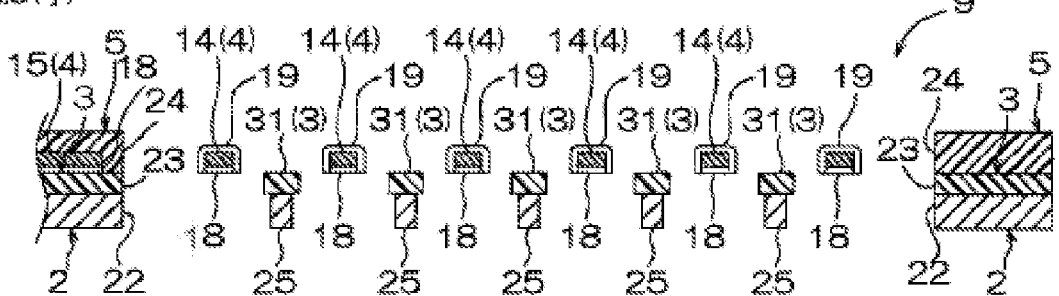

Next, as shown in FIG. 9(j), the plating layer 19 is formed over the upper surface and both side surfaces of each of the external-side terminals 14.

Figure 9K:
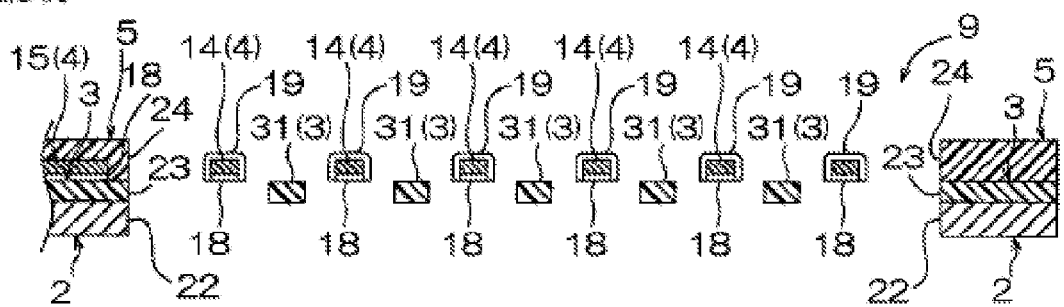

Next, as shown in FIG. 9(k), the reinforcing supporting portions 25 are removed.

Figure 9L:
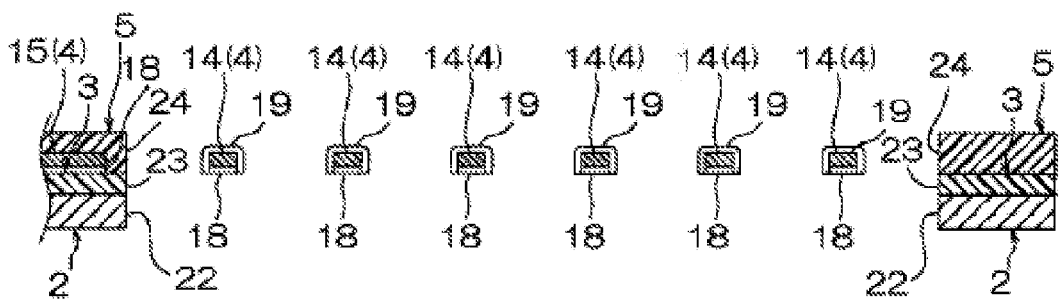

Then, as shown in FIG. 9(l), the plurality of reinforcing insulating portions 31 of the insulating base layer 3 exposed from the supporting-board-side opening 22 is removed by an etching method such as wet etching (e.g., chemical etching).

Next, the supporting board 2 is trimmed.

Next, in the same manner as in the foregoing producing method, the supporting board 2 is cleaned with a cleaning solvent such as, e.g., water, methanol, or acetone and subjected to an electrical inspection and an outer appearance inspection.

In this manner, the suspension board with circuit 1 is obtained.

The configuration of the suspension board with circuit 1 thus obtained is the same as the configuration of the suspension board with circuit 1 obtained in accordance with the foregoing producing method, though the production processes thereof are different.

Such a producing method of the suspension board with circuit 1 allows the supporting-board-side opening 22 of the supporting board 2 to be reinforced by the plurality of reinforcing supporting portions 25 and also allows the base-side opening 23 of the insulating base layer 3 to be reinforced by the plurality of reinforcing insulating portions 31, as shown in FIGS. 9(i)-9(l).

As a result, even when impact or vibration is applied to the suspension board with circuit 1 in the subsequent steps, i.e., the step (fifth step) of removing the plurality of terminal formation portions 27 of the insulating base layer 3 exposed from the supporting-board-side opening 22 by an etching method such as wet etching and the step of forming the plating layer 19 over the upper surface and both side surfaces of each of the external-side terminals 14, the plurality of external-side terminals 14 can be reliably protected with the reinforcing supporting portions 25 and the reinforcing insulating portions 31 each placed between the plurality of external-side terminals 14.

Consequently, before and after the production of the suspension board with circuit 1, it is possible to suppress warpage or breakage of the terminal portions 14.

Thus, in such a producing method of the suspension board with circuit 1, in the step (fifth step) of removing the plurality of terminal formation portions 27 of the insulating base layer 3 exposed from the supporting-board-side opening 22 by an etching method such as wet etching and the step of forming the plating layer 19 over the upper surface and side surfaces of each of the external-side terminals 14, it is possible to protect the external-side terminals 14 with the reinforcing insulating portions 31. In addition, by removing the plurality of reinforcing insulating portions 31, it is also possible to locate only the external-side terminals 14 in the base-side opening 23 and the supporting-board-side opening 22 when the suspension board with circuit 1 is projected in the thickness direction.

Also, in such a producing method of the suspension board with circuit 1, since the width L5 of each of the reinforcing insulating portions 31 is within the range shown above relative to the distance L4 between the external-side terminals 14, it is possible to protect the external-side terminals 14 with the reinforcing insulating portions 31 and also reliably expose both one surface and the other surface of each of the external-side terminals 14 in the thickness direction.

Therefore, in the production process of the suspension board with circuit 1, it is possible to suppress warpage or breakage of the terminal portions 14 and also reliably provide connection between each of the external-side terminals 14 and the external read/write board (not shown).

Referring to FIGS. 2(a) and 5(k), a modification of the first producing method of the wired circuit board is described. Note that, in the modification of the first producing method, the members corresponding to the individual parts described above are designated by the same reference numerals and a detailed description thereof is omitted.

In the suspension board with circuit 1 obtained in accordance with the producing method of the wired circuit board shown in FIGS. 3(a) to 5(l) described above, the suspension board with circuit 1 is obtained by removing the reinforcing supporting portions 25 in the external connecting portion 9, as shown in FIG. 5(l). However, it is also possible to obtain the suspension board with circuit 1 without removing the reinforcing supporting portions 25.

Specifically, as shown in FIG. 5(k), the plating layer 19 is formed over the upper surface and both side surfaces of each of the external-side terminals 14, and then the supporting board 2 is trimmed without removing the reinforcing supporting portions 25.

In this manner, the suspension board with circuit 1 including the external connecting portion 9 shown in FIGS. 2(a) and 5(k) is obtained.

In accordance with such a modification of the first producing method of the suspension board with circuit 1, even after the production thereof, the external-side terminals 14 can be protected with the reinforcing supporting portions 25.

In addition, since the plurality of external-side terminals 14 are exposed from between the plurality of reinforcing supporting portions 25, it is possible to reliably provide connection between each of the external-side terminals 14 and the external read/write board (not shown) and also suppress warpage or breakage of the terminal portions 14.

Next, referring to FIGS. 6 and 9(*j*), a modification of the second producing method of the wired circuit board is described.

Note that, in the modification of the second producing method, the members corresponding to the individual parts described above are designated by the same reference numerals and a detailed description thereof is omitted.

In the suspension board with circuit 1 obtained in accordance with the producing method of the wired circuit board shown in FIGS. 7(*a*) to 9(*l*) described above, the suspension board with circuit 1 is obtained by removing the reinforcing supporting portions 25 and the reinforcing insulating portions 31 in the external connecting portion 9, as shown in FIGS. 9(*k*) and 9(*l*). However, it is also possible to obtain the suspension board with circuit 1 without removing the reinforcing supporting portions 25 and the reinforcing insulating portions 31.

Specifically, as shown in FIG. 9(*j*), the plating layer 19 is formed over the upper surface and both side surfaces of each of the external-side terminals 14, and then the supporting board 2 is trimmed without removing the terminal formation portions 27.

In this manner, the suspension board with circuit 1 including the external connecting portion 9 shown in FIGS. 6 and 9(*j*) is obtained.

In accordance with such a modification of the second producing method of the suspension board with circuit 1, even after the production thereof, the reinforcing supporting portions 25 and the reinforcing insulating portions 31 are located so as to overlap each other. Therefore, the external-side terminals 14 can be more reliably protected with both of the reinforcing supporting portions 25 and the reinforcing insulating portions 31.

In addition, since the plurality of external-side terminals 14 are exposed from between the plurality of reinforcing supporting portions 25 and the plurality of reinforcing insulating portions 31, it is possible to reliably provide connection between each of the external-side terminals 14 and the external read/write board (not shown) and also suppress warpage or breakage of the terminal portions 14 during the connection.

In the above-described embodiment, the plurality of terminal formation portions 27 are removed in FIG. 5 (*j*) and FIG. 9 (*i*), and thereafter the plating layer 19 is formed over the upper surface and both side surfaces of each of the plurality of external-side terminals 14 in FIG. 5 (*k*) and FIG. 9 (*j*), but for example, it is also possible to remove the plurality of terminal formation portions 27, thereafter further remove the conductive thin film 18 formed on the lower surface of each of the plurality of external-side terminals 14 by, for example, wet etching, and then thereafter form the plating layer 19 over the upper surface, both side surfaces, and the lower surface of each of the plurality of external-side terminals 14.

EXAMPLES

While in the following, the present invention will be described more specifically with reference to EXAMPLES and COMPARATIVE EXAMPLE, the present invention is not limited thereto.

Example 1

A supporting board in a flat belt shape made of stainless steel, having a thickness of 18 nm, and extending in a longitudinal direction was prepared (see FIG. 3(*a*)).

Then, to the upper surface of the supporting board, a solution (varnish) of a photosensitive polyimide resin precursor was applied and dried to form a photosensitive base coating. The photosensitive base coating was exposed to light via a photomask not shown. The photomask included a light blocking portion, and a light full transmitting portion in a pattern. The light full transmitting portion was positioned to face the portion of the base coating in which an insulating base layer (including a plurality of terminal formation portions) was to be formed, and the light blocking portion was positioned to face the portion (i.e., the portion in which a base opening was to be formed) of the base coating in which the insulating base layer was not to be formed. Then, the exposed base coating was developed and cured by heating to form the insulating base layer made of polyimide and having a thickness of 8 μm. At this time, in an external connecting portion, the insulating base layer was formed in a pattern formed with the base-side opening which overlaps a supporting-board-side opening formed later when projected in a thickness direction and also with a plurality of terminal formation portions corresponding to a plurality of external-side terminals (see FIG. 3(*b*)).

Then, a chromium thin film having a thickness of 300 Å was formed by a sputter vapor deposition method over the upper surface of the insulating base layer and the upper surface of the supporting board exposed from the base-side opening (see FIG. 3(*c*)).

Then, a plating resist was formed on the upper surface of the conductive thin film into a pattern reverse to a conductive pattern (head-side terminals, the external-side terminals, and wires) (see FIG. 3(*d*)).

Then, by electrolytic copper plating, the conductive pattern (the head-side terminals, the external-side terminals, and the wires) having a thickness of 12 μm was formed on the upper surface of the conductive thin film exposed from the plating resist (see FIG. 4(*e*)).

The width (widthwise length) of each of the head-side terminals was 55 μm.

The spacing between the plurality of head-side terminals was 32 μm.

The width of each of the external-side terminals (longitudinal length which is the width L3 of the external-side terminal) was 160 μm.

The spacing between the plurality of external-side terminals (the distance L4 between the external-side terminals) was 420 μm.

The width (widthwise length) of each of the wires was 15 μm.

The spacing between the plurality of wires was 15 μm.

Then, the plating resist was removed by etching (see FIG. 4(*f*)).

Then, the conductive thin film exposed from the conductive pattern (the head-side terminals, the external-side terminals, and the wires) was removed by wet etching (see FIG. 4(*g*)).

Then, to the upper surface of the insulating base layer including the wires, a solution (varnish) of a photosensitive polyimide resin precursor was applied to form a photosensitive cover coating. Then, in the same manner as for the insulating base layer, the photosensitive cover coating was exposed to light via a photomask not shown, developed, and cured by heating to form an insulating cover layer made of polyimide and having a thickness of 5 μm in a pattern covering the wires, exposing the head-side terminals and the external-side terminals, and formed with a cover-side opening (see FIG. 4(*h*)).

Then, the supporting board in the external connecting portion was partially removed by wet etching to form the supporting-board-side opening and reinforcing supporting portions (see FIG. 4(*i*)).

The longitudinal length of the supporting-board-side opening was 5580 μm, and the widthwise length thereof (the width L2 of the supporting-board-side opening) was 470 μm.

The width of each of the reinforcing supporting portions (longitudinal length which is the width L1 of the reinforcing supporting portion) was 300 μm, and the length (widthwise length) thereof was 470 μm.

The spacing between the plurality of reinforcing supporting portions was 280 μm.

Then, the plurality of terminal formation portions of the insulating base layer exposed from the supporting-board-side opening were removed by wet etching to configure the external-side terminals as flying leads (see FIG. 4(j)).

Then, by electrolytic nickel plating and electrolytic gold plating, a nickel plating layer having a thickness of 0.35 μm and a gold plating layer having a thickness of 2.5 μm were successively formed over the upper surfaces and both side surfaces of the external-side terminals (see FIG. 5(k)).

Then, by wet etching, the reinforcing supporting portions were removed and the supporting board was trimmed simultaneously (see FIG. 5(l)).

In this manner, the suspension board with circuit was obtained (see FIGS. 2(b) and 5(l)).

In the production process of the suspension board with circuit, no deformation occurred in the external-side terminals configured as the flying leads.

Example 2

A suspension board with circuit was obtained in accordance with the same method as used in EXAMPLE 1 except that, in the individual steps described above, each of the reinforcing supporting portions was formed to have a width (longitudinal length which is the width L1 of the reinforcing supporting portion) of 50 μm (see FIGS. 2(b) and 5(l)).

In the production process of the suspension board with circuit, no deformation occurred in the external-side terminals configured as the flying leads.

Example 3

A suspension board with circuit was obtained in accordance with the same method as used in EXAMPLE 1 except that, in the individual steps described above, the reinforcing supporting portions were not removed (see FIGS. 2(a) and 5(k)).

In the production process of the suspension board with circuit, no deformation occurred in the external-side terminals configured as the flying leads.

Example 4

A supporting board in a flat belt shape made of stainless steel, having a thickness of 18 μm, and extending in the longitudinal direction was prepared (see FIG. 3(a)).

Then, to the upper surface of the supporting board, a solution (varnish) of a photosensitive polyimide resin precursor was applied and dried to form a photosensitive base coating. The photosensitive base coating was exposed to light via a photomask not shown. The photomask included a light blocking portion, and a light full transmitting portion in a pattern. The light full transmitting portion was positioned to face the portion of the base coating in which an insulating base layer (including a plurality of terminal formation portions) was to be formed, and the light blocking portion was positioned to face the portion (i.e., the portion in which a base opening was to be formed) of the base coating in which the insulating base layer was not to be formed. Then, the exposed base coating was developed and cured by heating to form the insulating base layer made of polyimide and having a thickness of 8 μm. At this time, in an external connecting portion, the insulating base layer was formed in a pattern formed with the base-side opening which overlaps a supporting-board-side opening formed later when projected in a thickness direction, with a plurality of terminal formation portions corresponding to a plurality of external-side terminals, and also with a plurality of reinforcing insulating portions (see FIG. 7(a)).

The width of each of the reinforcing insulating portions (longitudinal length which is the width L5 of the reinforcing insulating portion) was 100 μm, and the length (widthwise length) thereof was 520 μm.

Then, a chromium thin film having a thickness of 300 Å was formed by a sputter vapor deposition method over the upper surface of the insulating base layer and the upper surface of the supporting board exposed from the base-side opening (see FIG. 7(b)).

Then, a plating resist was formed on the upper surface of the conductive thin film into a pattern reverse to a conductive pattern (head-side terminals, the external-side terminals, and wires) (see FIG. 7(c)).

Then, by electrolytic copper plating, the conductive pattern (the head-side terminals, the external-side terminals, and the wires) having a thickness of 12 μm was formed on the upper surface of the conductive thin film exposed from the plating resist (see FIG. 7(d)).

The width (widthwise length) of each of the head-side terminals was 55 μm.

The spacing between the plurality of head-side terminals was 32 μm.

The width of each of the external-side terminals (longitudinal length which is the width L3 of the external-side terminal) was 200 μm.

The spacing (the distance L4 between the external-side terminals) between the plurality of external-side terminals was 520 μm.

The width (widthwise length) of each of the wires was 15 μm.

The spacing between the plurality of wires was 15 μm.

Then, the plating resist was removed by etching (see FIG. 8(e)).

Then, the conductive thin film exposed from the conductive pattern (the head-side terminals, the external-side terminals, and the wires) was removed by wet etching (see FIG. 8(f)).

Then, to the upper surface of the insulating base layer including the wires, a solution (varnish) of a photosensitive polyimide resin precursor was applied to form a photosensitive cover coating. Then, in the same manner as for the insulating base layer, the photosensitive cover coating was exposed to light via a photomask not shown, developed, and cured by heating to form an insulating cover layer made of polyimide and having a thickness of 5 μm in a pattern covering the wires, exposing the head-side terminals and the external-side terminals, and formed with a cover-side opening (see FIG. 8(g)).

Then, the supporting board in the external connecting portion was partially removed by wet etching to form the supporting-board-side opening and reinforcing supporting portions (see FIG. 8(h)).

The longitudinal length of the supporting-board-side opening was 5580 μm, and the widthwise length thereof (the width L2 of the supporting-board-side opening) was 700 μm.

The width of each of the reinforcing supporting portions (longitudinal length which is the width L1 of the reinforcing supporting portion) was 60 μm, and the length (widthwise length) thereof was 700 μm.

The spacing between the plurality of reinforcing supporting portions was 400 μm.

Then, the plurality of terminal formation portions of the insulating base layer exposed from the supporting-board-side opening were removed by wet etching to configure the external-side terminals as flying leads (see FIG. 9(i)).

Then, by electrolytic nickel plating and electrolytic gold plating, a nickel plating layer having a thickness of 0.35 μm and a gold plating layer having a thickness of 2.5 μm were successively formed over the upper surfaces and both side surfaces of the external-side terminals (see FIG. 9(j)).

Then, by wet etching, the reinforcing supporting portions were removed and the supporting board was trimmed simultaneously (see FIG. 9(k)).

Then, by wet etching, the reinforcing insulating portions were removed (see FIG. 9(l)).

In this manner, the suspension board with circuit was obtained (see FIGS. 2(b) and 9(l)).

In the production process of the suspension board with circuit, no deformation occurred in the external-side terminals configured as the flying leads.

Example 5

A suspension board with circuit was obtained in accordance with the same method as used in EXAMPLE 4 except that, in the individual steps described above, each of the reinforcing supporting portions was formed to have a width (longitudinal length which is the width L1 of the reinforcing supporting portion) of 100 μm and each of the reinforcing insulating portions was formed to have a width (longitudinal length which is the width L5 of the reinforcing insulating portion) of 520 μm (see FIGS. 2(b) and 9(l)).

In the production process of the suspension board with circuit, no deformation occurred in the external-side terminals configured as the flying leads.

Example 6

A suspension board with circuit was obtained in accordance with the same method as used in EXAMPLE 4 except that, in the individual steps described above, the reinforcing supporting portions and the reinforcing insulating portions were not removed (see FIGS. 6 and 9(j)).

In the producing method of the suspension board with circuit, no deformation occurred in the external-side terminals configured as the flying leads.

Comparative Example 1

A suspension board with circuit was obtained in accordance with the same method as used in EXAMPLE 1 except that, in the individual steps described above, when the supporting board was partially removed, only the supporting-board-side opening was formed and the reinforcing supporting portions were not formed (see FIGS. 2(b) and 5(l)).

In the production process of the suspension board with circuit, deformation occurred in some of the external-side terminals configured as the flying leads.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A method of producing a wired circuit board, comprising:
a first step of preparing a metal supporting layer;
a second step of forming, on one side of the metal supporting layer in a thickness direction thereof, an insulating layer having a first opening, and a plurality of terminal formation portions placed in the first opening to be spaced apart from each other;
a third step of forming, on one side of the insulating layer in the thickness direction, a conductive layer having a plurality of terminal portions each corresponding to the plurality of terminal formation portions;
a fourth step of partially removing the metal supporting layer to form a second opening which includes the plurality of terminal formation portions when projected in the thickness direction, and at least one reinforcing metal supporting portion placed between the plurality of terminal formation portions in the second opening; and
a fifth step of removing the plurality of terminal formation portions exposed from the second opening to expose both side surfaces of the plurality of terminal portions in the thickness direction.

2. The method of producing a wired circuit board according to claim 1, further comprising, after the fifth step, the step of:
removing the reinforcing metal supporting portion.

3. The method of producing a wired circuit board according to claim 1, wherein, in the second step, the insulating layer is formed to further have, in the first opening, a reinforcing insulating portion which overlaps the reinforcing metal supporting portion when projected in the thickness direction.

4. The method of producing a wired circuit board according to claim 3, further comprising the step of:
removing the reinforcing insulating portion.

5. The method of producing a wired circuit board according to claim 3, wherein a length of the reinforcing insulating portion in a direction in which the plurality of terminal portions are adjacent to each other is in a range of 10% to 100% of a distance between the plurality of terminal portions.

6. The method of producing a wired circuit board according to claim 1, wherein a length of the reinforcing metal supporting portion in a direction in which the plurality of terminal portions are adjacent to each other is in a range of 10% to 100% of a distance between the plurality of terminal portions.

* * * * *